United States Patent [19]

Doucet et al.

[11] 4,012,095
[45] Mar. 15, 1977

[54] COAXIAL INTERFACE ADAPTOR HAVING DUAL-IN-LINE CONFIGURATION

[75] Inventors: Leonard A. Doucet, Norton, Mass.; Richard M. Grubb, Cumberland, R.I.

[73] Assignee: Augat, Inc., Attleboro, Mass.

[22] Filed: Oct. 2, 1975

[21] Appl. No.: 618,785

[52] U.S. Cl. .......................... 339/17 C; 339/177 R
[51] Int. Cl.² ........................................ H05K 1/00
[58] Field of Search ............ 339/17 R, 17 D, 17 C, 339/66 M, 177 R

[56] References Cited
UNITED STATES PATENTS

| 2,869,090 | 1/1959 | Johanson | 339/17 R |
| 2,944,240 | 4/1960 | Barber | 339/66 M X |
| 3,029,365 | 4/1962 | Plesser | 339/17 C |
| 3,457,541 | 7/1969 | Ransil et al. | 339/17 R |
| 3,487,350 | 12/1969 | Hammell | 339/17 C |

*Primary Examiner*—Gerald A. Dost
*Attorney, Agent, or Firm*—Weingarten, Maxham & Schurgin

[57] ABSTRACT

An adaptor for interfacing coaxial cable with electronic circuit boards. The adaptor has a shape similar to a dual-in-line electronic circuit package with contact pins extending therefrom and includes one or more miniature coaxial connectors for plug-in connection of a coaxial cable thereto.

15 Claims, 4 Drawing Figures

COAXIAL INTERFACE ADAPTOR HAVING DUAL-IN-LINE CONFIGURATION

FIELD OF THE INVENTION

This invention relates generally to electronic interconnection apparatus and more particularly to an adaptor for conveniently pluggably coupling coaxial cables to a dual-in-line array in a panel board or printed circuit board.

DISCUSSION OF THE PRIOR ART

Previously, in order to connect a coaxial cable to a printed circuit or panel board, it was necessary to modify the board to add a coaxial connector thereto. In such instances, the coaxial connector often is not located convenient to the circuit to which it is to be connected and other wires must be connected between the circuit and the coaxial connector. The addition of such interconnecting wires tends to introduce circuit discontinuities that degrade circuit performance. Alternatively, a coaxial cable is sometimes routed directly to the appropriate circuit. This avoids the discontinuities caused by using a coaxial connector at some other location on the panel board but does not include the flexibility of quick connection and disconnection which would be permitted by a plug-in coaxial connector. In such instances, the coaxial wire end and shield braid must be soldered to terminals on the panel board, thus introducing possibilities of and increasing the rate of failure.

SUMMARY OF THE INVENTION

This invention is a coaxial cable adaptor module and it generally comprises a substantially flat rectangular insulative substrate having holes therethrough and pins mounted therein in dual-in-line configuration. The flat side of the substrate opposite the projecting contact pins includes one or more miniature coaxial connectors which are interconnected to the appropriate contact pins by conventional printed circuitry. These miniature coaxial connectors mounted to the substrate permit quick connection and disconnection of the plug end of a coaxial cable.

Thus it is possible to permit placement of one or more coaxial cables in the vicinity of one or more specific circuits having critical signal paths, without disturbing the desired geometry of the circuit board. Interconnecting wires between the adaptor module and the critical circuit may be kept short to maintain signal integrity. Each coaxial connector on the substrate has a center or signal terminal which is electrically isolated from other signal terminals by a ground foil on the contact pin side of the substrate. Electrical interconnection is provided by printed circuitry means between the signal terminal of the coaxial connector and one of the dual-in-line pins of the adaptor.

The adaptor of this invention may be used with transistor-transistor logic (TTL) panel boards, with emitter-coupled logic (ECL) panel boards, and with various other types of electronic interconnection boards including wire wrapping panel boards, printed circuit boards and boards with single or multiple conductive foil planes.

BRIEF DESCRIPTION OF THE DRAWING

The advantages, objects and features of this invention will be more clearly understood from the following detailed description when taken in conjunction with the accompanying drawing in which.

DESCRIPTION OF THE PREFERRED EMBODIMENT

Figure 4:
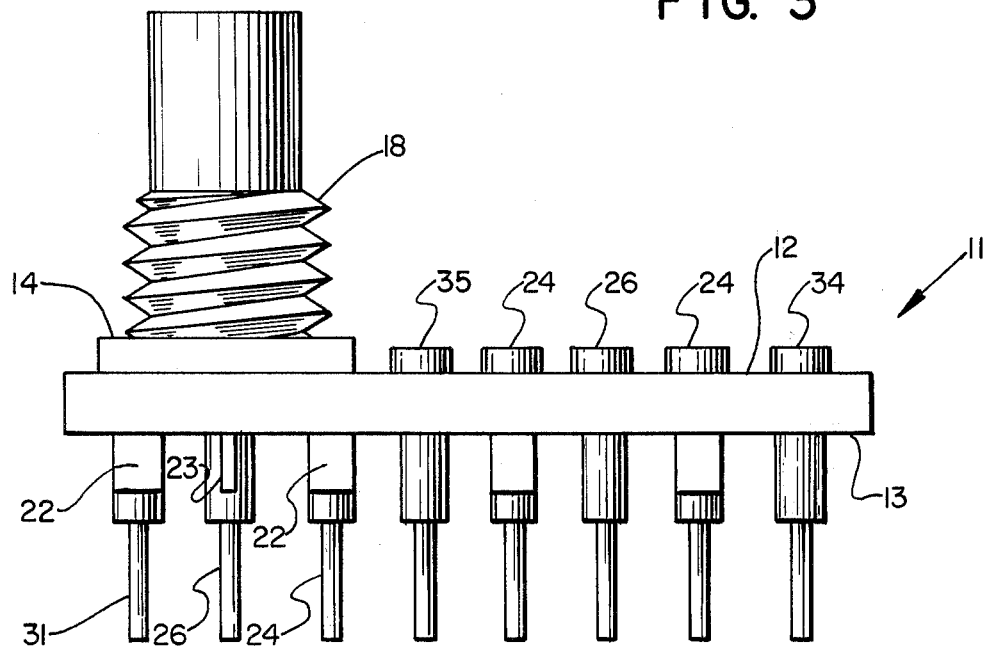
FIG. 4 is a side elevational view of the adaptor of FIG. 2.

With reference now to the drawing, there is shown a coaxial interface adaptor 11 having a typical sixteen-pin dual-in-line configuration. The adaptor comprises an electrically insulative substrate 12 having a substantially flat rectangular configuration and having conductive foil 13, typically copper, on the bottom side thereof. A conventional miniature coaxial connector 14 is shown mounted in coaxial connector location 15 on the top side of substrate 12. Location 16 is shown in dotted lines without a coaxial connector mounted thereto. Each coaxial connector location is defined by four holes 17 and a center hole 21 through the substrate. Holes 17 are adapted to receive ground posts 22 extending from the four corners of connector 14 (see FIG. 4). These ground posts are soldered to foil 13 to provide electrical ground connection as well as positive mechanical mounting of the connector to the substrate. Pin 23 projects through central hole 21 of location 15 and is the signal connection from the coaxial connector 14 to the substrate. Separate from connector 14 are contact pins 24 which serve to complete the dual-in-line configuration of the adaptor.

Figure 3:
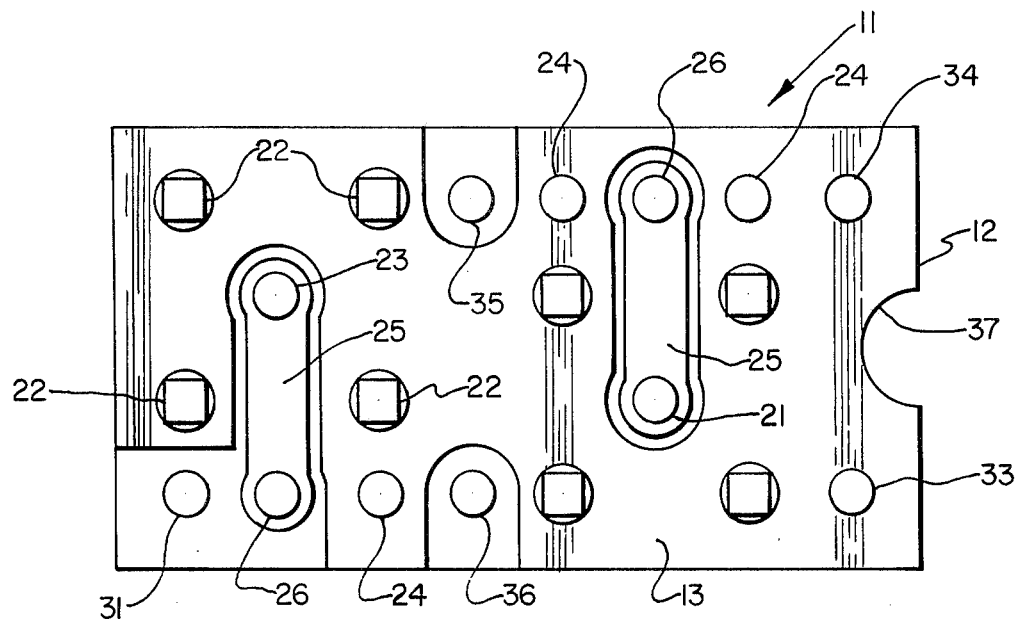
FIG. 3 is a bottom plan view of the adaptor of FIG. 1.

With specific reference now to FIG. 3, the electrical interconnection of the adaptor is shown. Most of the downward facing surface of the substrate is covered with ground foil 13. Ground posts 22 of the connector are electrically connected to this foil to establish the ground plane of the adaptor. Foil path 25 connects signal pin 23 of the connector to contact pin 26. An electronic signal introduced to the substrate by the coaxial cable is distributed as desired to circuitry on the panel board 27 through this contact pin 26. Of course signals may be either incoming or outgoing through the coaxial cable 28. Note that contact pin 31 is not connected to the ground foil 13 of this adaptor but it is electrically floating and may be used for other purposes, an example of which is set forth hereinbelow.

While it is not electrically necessary to have contact pins 24 mounted in all of the remaining holes in the dual-in-line array in substrate 12, it is desirable for purposes of structural ruggedness. Coaxial cable is relatively heavy compared with integrated circuitry and the circuit boards associated therewith. It is possible that a significant amount of "whipping" of the relatively heavy cable due to machine vibration could occur. Therefore, by employing a contact pin in each of the holes available in the substrate, the coaxial interface adaptor of this invention may be securely and ruggedly mounted to the panel board and the effects of vibration in the circuitry thereby reduced to a minimum.

Figure 1:
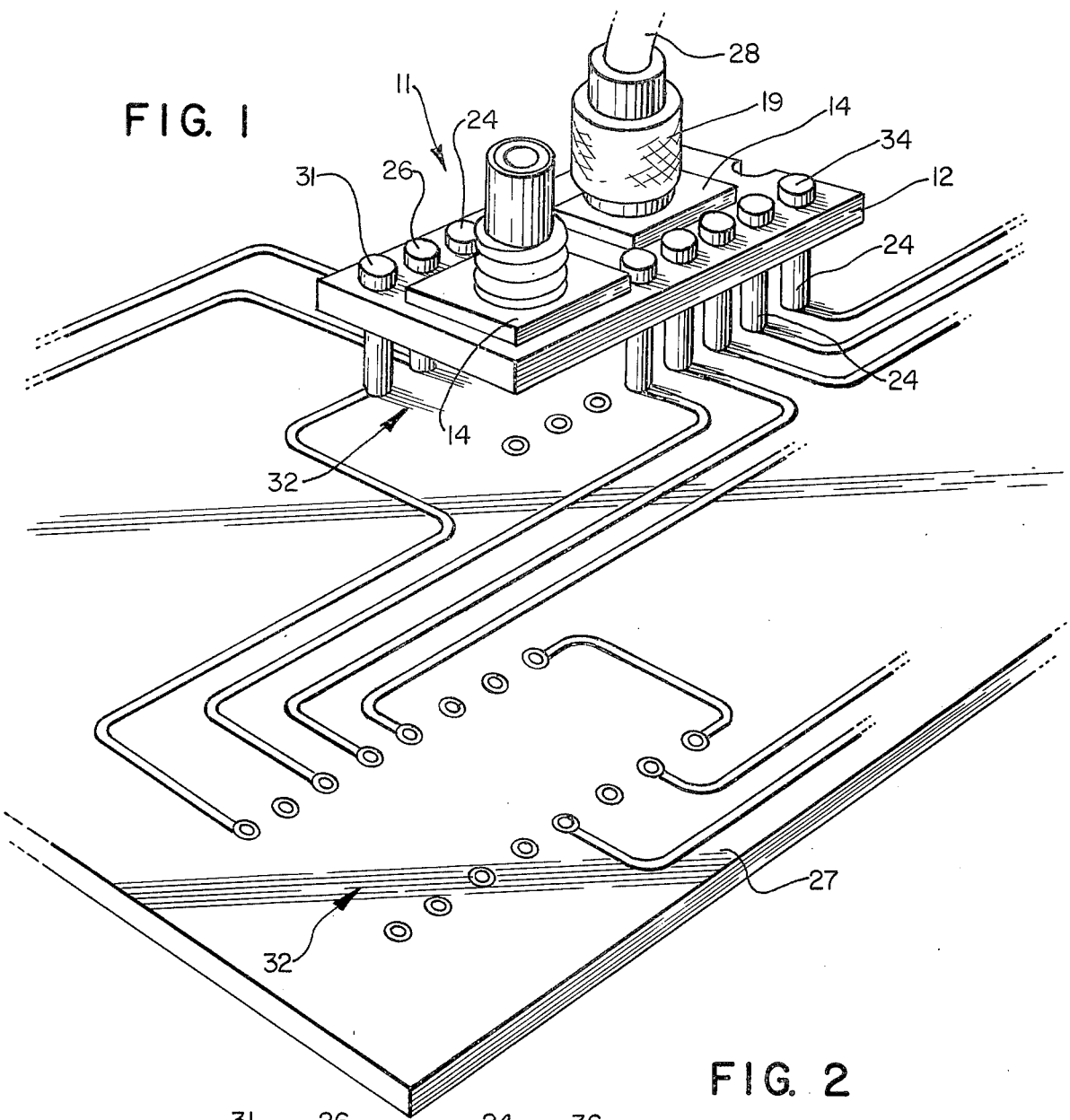
FIG. 1 is a perspective view of a portion of a printed circuit board with an adaptor of this invention mounted thereto.

Interconnection of the coaxial cable to the circuitry of the panel board to which the adaptor is mounted may be made by conventional wire wrapping techniques or by printed circuitry as desired. FIG. 1 shows the adaptor of this invention mounted to a printed circuit board 27 having a plurality of dual-in-line arrays of holes 32. An adaptor 11 is mounted to one such array and a coaxial cable 28 is plugged into one coaxial connector 14. By means of this adaptor, a coaxial cable is easily pluggable in a dual-in-line array in an electronic interconnection board of any type. The adaptor itself is pluggable into an array of holes or socket contacts in such a board and the coaxial cable is pluggable into a coaxial connector 14 which is part of the adaptor of this invention. Connector 14 is normally provided with threads 18 to which internally threaded collar 19 of the cable 28 is threadedly engaged. Contact pins such as 24, 26 and 31 may be soldered to the circuit board, or they may remain pluggable. Also, the dual-in-line array may be any size, that is, 14-pin, 16-pin, or others.

Figure 2:
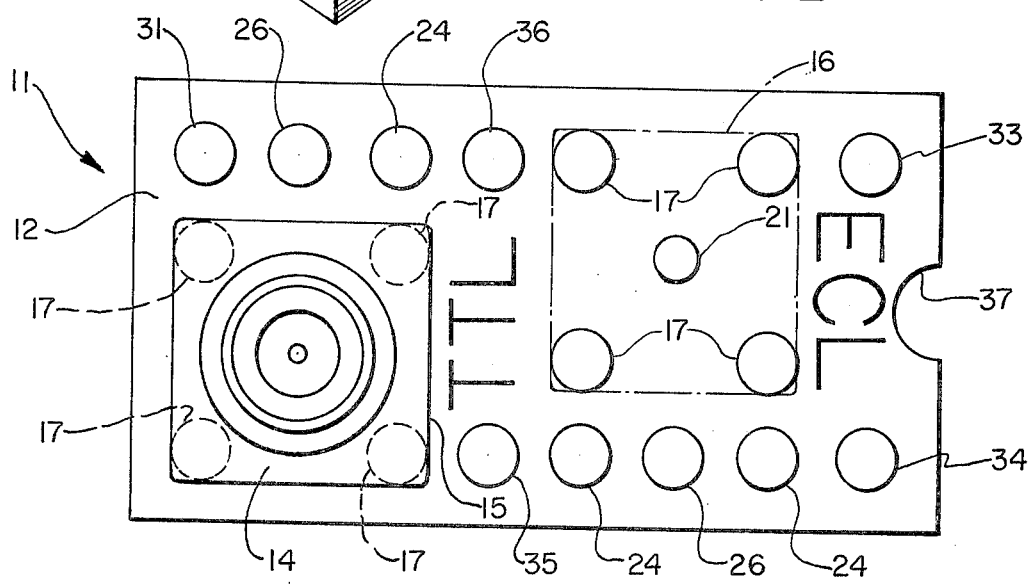
FIG. 2 is a top plan view of the adaptor shown in FIG. 1 with only one coaxial connector mounted thereto.

In FIG. 2 the letters ECL and TTL appear on the top surface of the substrate 12, facing in opposite directions. These letters indicate that the adaptor may be used interchangeably, by rotating it 180° with both types of logic boards. In ECL logic, both of end conact pins 33, 34 are connected to the ground plane portion of foil 13 and are located adjacent to polarization notch 37. These are pins 1 and 16 respectively of conventional dual-in-line configurations and both are normally grounded in ECL logic, that is, they are electrically connected to the ground plane of such a panel board. However, in TTL logic, pin 16 is normally connected to a voltage plane other than ground, so by rotating adaptor 11 by 180°, floating pin 31 becomes pin 16 of the dual-in-line array and may be electrically connected as desired.

Referring now to FIG. 3, it may be seen that pins 35 and 36 are also electrically floating. These are provided so that another electrical component such as a resistor, capacitor or other element, may be connected in series in the coaxial signal line if desired.

The substrate of this invention may be any suitable electrically insulative material such as conventional glass epoxy. The contact pins are conventional material, typically phosphor bronze, gold over nickel plated. Conductive foil 13 is normally copper, appropriately etched and wave soldered to secure the various pins and posts thereto. The standard coaxial connector 14 is depicted as having a square base. Of course, it may have any other shape as desired, and it need not have four ground posts since only one is electrically necessary. Also signal pin 23 need not be in the center of the connector.

All spacings of holes and pins in this adaptor are based on the typical dual-in-line modular distance of 0.100 inch (2.54 mm). Thus the holes through the substrate adjacent the edges thereof are spaced by 0.100 inch and are basically arranged in parallel rows which are spaced by 0.300 inch (7.62 mm). Two of the ground post holes of each coaxial connector location reside in one of the rows of holes along the edges. Typically the ground posts are spaced by 0.200 inch (5.08 mm). The signal pin is shown in the center of the connector, and is, of course, also on the same modular system.

In view of the above description, it is likely that changes and improvements will occur to those skilled in this art and which are within the scope of this invention.

What is claimed is:

1. A coaxial interface adaptor for coupling a coaxial cable to a dual-in-line array of holes in an electronic interconnection board, said adaptor comprising:
   a substantially flat rectangular substrate having spaced parallel rows of a plurality of regularly spaced holes adjacent to the opposite long edges thereof, at least one coaxial connector location being defined by a plurality of ground post holes through said substrate and having a signal pin hole therethrough within the confines of said coaxial connector location;
   a layer of electrically conductive material substantially covering a first side of said substrate, said layer having electrically separate coplanar ground conductor and signal conductor areas;
   a coaxial connector mounted to the second side of said substrate, said connector having a plurality of ground posts extending through said ground post holes in said substrate and a signal pin extending through said signal pin hole, said ground posts being connected electrically to said ground conductor and said signal pin being electrically connected to said signal conductor; and
   a contact pin mounted in each of at least some of said holes adjacent the opposite edges of said substrate, said contact pins extending from said first side of said substrate, said adaptor thereby having a dual-in-line configuration.

2. The coaxial interface adaptor recited in claim 1 wherein said signal conductor electrically interconnects said signal pin to one of said contact pins.

3. The coaxial interface adaptor recited in claim 1 wherein said substrate is formed of electrically insulative material.

4. The coaxial interface adaptor recited in claim 1 wherein said coaxial connector location is defined by four ground post holes arranged in a square, said signal pin hole being located equidistant from said ground post holes.

5. The coaxial interface adaptor recited in claim 1 wherein at least one of said ground posts resides in one of said spaced parallel rows of holes in said substrate.

6. The coaxial interface adaptor recited in claim 5 wherein said holes in said parallel rows of holes are spaced by 0.100 inch, said rows are spaced by 0.300 inch, and said ground post holes are spaced by a multiple of 0.100 inch.

7. The coaxial interface adaptor recited in claim 4 wherein two of said ground posts reside in one of said spaced parallel rows of holes in said substrate, said ground posts being spaced by multiples of the same modular distance as said holes in said spaced parallel rows of holes.

8. The coaxial interface adaptor recited in claim 1 wherein said substrate is formed with two coaxial connector locations.

9. The coaxial interface adaptor recited in claim 8 wherein a coaxial connector is mounted in each of said coaxial connector locations.

10. The coaxial interface adaptor recited in claim 9 wherein said signal pin of each said coaxial connector is electrically interconnected to an individual one of said contact pins by means of individual signal conductors electrically isolated from each other and from said ground conductor.

11. The coaxial interface adaptor recited in claim 1 wherein one of said contact pins located at one corner of said substrate is electrically isolated from said layer of electrically conductive material.

12. The coaxial interface adaptor recited in claim 11 wherein at least an additional one of said contact pins adjacent said coaxial connector location is electrically isolated from said layer of electrically conductive material.

13. The coaxial interface adaptor recited in claim 11 wherein said substrate is formed with a polarization notch at one end opposite the end wherein said corner electrically isolated contact pin is located.

14. The coaxial interface adaptor recited in claim 1 wherein at least some of said contact pins are electrically connected to said ground conductor.

15. A coaxial interface adaptor for coupling a coaxial connector to a dual-in-line array of holes in an electronic interconnection board, said adaptor comprising:
   a substantially flat rectangular substrate having spaced parallel rows of a plurality of regularly spaced holes adjacent to the opposite long edges thereof, at least one coaxial connector location being defined by a plurality of ground post holes through said substrate and having a signal pin hole therethrough within the confines of said coaxial connector location, said ground post holes being adapted to receive the ground posts of a coaxial connector, said signal pin hole being adapted to receive the signal pin of said coaxial connector;
   a layer of electrically conductive material substantially covering a first flat side of said substrate, said layer having electrically separate coplanar ground conductor and signal conductor areas; and
   a contact pin mounted in each of at least some of said holes adjacent the opposite edges of said substrate, said contact pins extending from said first side of said substrate, said adaptor thereby having a dual-in-line configuration.

* * * * *